United States Patent
Grivna

(10) Patent No.: US 10,916,474 B2
(45) Date of Patent: Feb. 9, 2021

(54) METHOD OF REDUCING RESIDUAL CONTAMINATION IN SINGULATED SEMICONDUCTOR DIE

(71) Applicant: SEMICONDUCTOR COMPONENTS INDUSTRIES, LLC, Phoenix, AZ (US)

(72) Inventor: Gordon M. Grivna, Mesa, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/405,168

(22) Filed: May 7, 2019

(65) Prior Publication Data

US 2019/0393088 A1 Dec. 26, 2019

Related U.S. Application Data

(60) Provisional application No. 62/689,481, filed on Jun. 25, 2018.

(51) Int. Cl.
| H01L 21/00 | (2006.01) |
| H01L 21/78 | (2006.01) |
| H01L 21/67 | (2006.01) |
| H01L 21/3065 | (2006.01) |

(52) U.S. Cl.
CPC ........ *H01L 21/78* (2013.01); *H01L 21/30655* (2013.01); *H01L 21/67288* (2013.01)

(58) Field of Classification Search
CPC .................. H01L 21/78; H01L 21/30655
See application file for complete search history.

(56) References Cited

U.S. PATENT DOCUMENTS

| 5,271,774 A * | 12/1993 | Leenaars ........... H01L 21/67034 134/31 |
| 5,401,690 A | 3/1995 | Chen |
| 5,919,713 A | 7/1999 | Ishii et al. |
| 6,406,979 B2 | 6/2002 | Fischer et al. |
| 6,642,127 B2 | 11/2003 | Kumar et al. |
| 6,705,925 B1 | 3/2004 | Cole et al. |
| 7,060,531 B2 | 6/2006 | Arita |
| 7,781,310 B2 | 8/2010 | Grivna |

(Continued)

FOREIGN PATENT DOCUMENTS

| EP | 1873824 A1 | 1/2008 |
| WO | 2014052445 A1 | 4/2015 |

OTHER PUBLICATIONS

Search Report for EP Application No. 13181098.8, dated Nov. 10, 2014, 5 pages.

*Primary Examiner* — Caridad Everhart
*Assistant Examiner* — Ankush K Singal
(74) *Attorney, Agent, or Firm* — Kevin B. Jackson

(57) ABSTRACT

A method for processing electronic die includes providing a substrate having a plurality of electronic die formed as part of the substrate and separated from each other by spaces. The method includes placing the substrate onto a first carrier substrate. The method includes plasma etching the substrate through the spaces to form singulation lines adjacent the plurality of electronic die. The method includes exposing the plurality of electronic die to solvent vapors, such as heated solvent vapors, under reduced pressure to reduce the presence of residual contaminants resulting from the plasma etching step.

20 Claims, 7 Drawing Sheets

(56) References Cited

U.S. PATENT DOCUMENTS

| | | |
|---|---|---|
| 7,985,661 B2 | 7/2011 | Grivna |
| 7,989,319 B2 | 8/2011 | Grivna et al. |
| 8,012,857 B2 | 9/2011 | Grivna et al. |
| 8,507,363 B2 | 8/2013 | Lei et al. |
| 8,598,016 B2 | 12/2013 | Yalamanchili et al. |
| 8,664,089 B1 | 3/2014 | Burghout et al. |
| 9,472,458 B2 | 10/2016 | Doub et al. |
| 2005/0196940 A1 | 9/2005 | Yajima et al. |
| 2009/0020140 A1* | 1/2009 | Wan .................. C23C 16/4407 134/13 |
| 2009/0061595 A1 | 3/2009 | Weber et al. |
| 2009/0191690 A1 | 7/2009 | Boyle et al. |
| 2010/0120230 A1 | 5/2010 | Grivna et al. |
| 2010/0173474 A1 | 7/2010 | Arita et al. |
| 2011/0175242 A1 | 7/2011 | Grivna et al. |
| 2011/0177675 A1 | 7/2011 | Grivna et al. |
| 2011/0244657 A1 | 10/2011 | Grivna et al. |
| 2014/0051232 A1 | 2/2014 | Burghout et al. |
| 2014/0057414 A1 | 2/2014 | Iyer et al. |
| 2014/0134828 A1 | 5/2014 | Burghout et al. |
| 2015/0228494 A1 | 8/2015 | Burghout et al. |
| 2019/0157100 A1* | 5/2019 | Harikai ............. H01L 21/67069 |

\* cited by examiner

METHOD OF REDUCING RESIDUAL CONTAMINATION IN SINGULATED SEMICONDUCTOR DIE

CROSS REFERENCE TO RELATED APPLICATIONS

This application claims priority to U.S. Provisional Application No. 62/689,481 filed on Jun. 25, 2018, the content of which is hereby incorporated by reference.

BACKGROUND

The present description relates, in general, to electronics and, more particularly, to methods of forming semiconductors.

In the past, the semiconductor industry utilized various methods and equipment to singulate individual semiconductor die from a semiconductor wafer on which the die was manufactured. Typically, a technique called scribing or dicing was used to either partially or fully cut through the wafer with a diamond cutting wheel along scribe grids or singulation lines that were formed on the wafer between the individual die. To allow for the alignment and the width of the dicing wheel each scribe grid usually had a large width, generally about one hundred fifty (150) microns, which consumed a large portion of the semiconductor wafer. Additionally, the time required to scribe each singulation line on the semiconductor wafer could take over one hour or more. This time reduced the throughput and manufacturing capacity of a production facility.

Other methods, which have included thermal laser separation (TLS), laser ablation dicing, and plasma dicing, have been explored as alternatives to scribing. Plasma dicing is a promising process compared to scribing and other alternative processes because it supports narrower scribe lines, has increased throughput, does not damage the semiconductor material, and can singulate die in varied and flexible patterns. However, plasma dicing has had manufacturing implementation challenges. Such challenges have included non-compatibility with wafer backside layers, such as backmetal layers, because the etch process has been unable to effectively remove the backside layers from the singulation lines. Removing the backside layers from the scribe lines is necessary to facilitate subsequent processing, such as pick-and-place and assembly processes. Further, plasma dicing can leave contaminates, such as residual polymer materials or fluorine residues, on surfaces, including but not limited to sidewall surfaces, of the singulated die. Such contaminants can reduce the quality and reliability of the singulated die.

Accordingly, it is desirable to have a method of reducing the presence of residual contaminates from die separated from a semiconductor wafer. It would be beneficial for the method to be cost effective, and to minimize any damage to the separated die.

Figure 1:
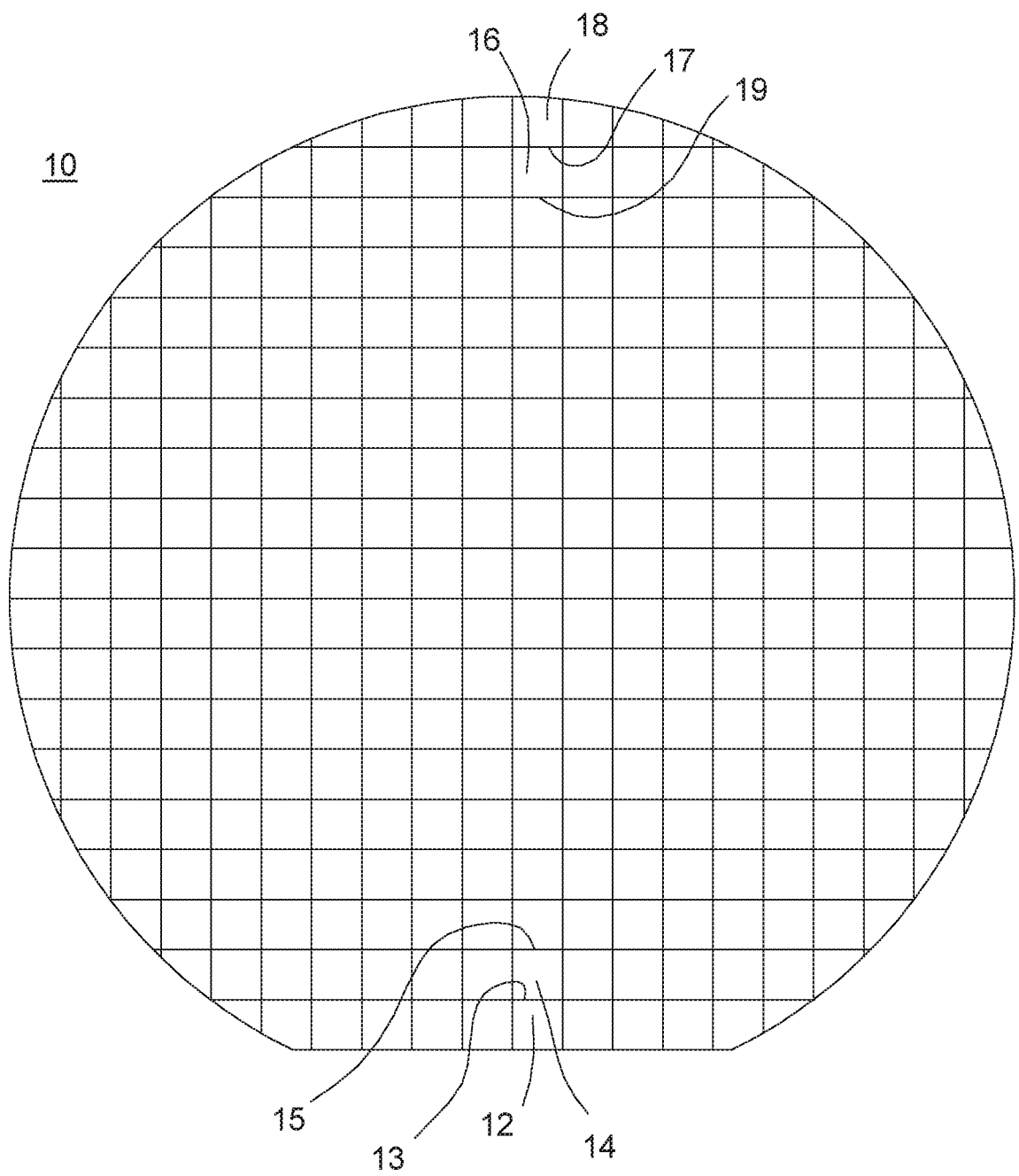
FIG. 1 illustrates a reduced plan view of an example of a semiconductor wafer in accordance with the present description.

For simplicity and clarity of the illustration, elements in the figures are not necessarily drawn to scale, and the same reference numbers in different figures denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Further, it is understood that the examples illustrated and described hereinafter suitably may have embodiments and/or may be practiced in the absence of any element that is not specifically disclosed herein.

DETAILED DESCRIPTION OF THE DRAWINGS

The present description includes, among other features, a method for singulating electronic die from substrate using plasma etch singulation and removing residual films and/or contaminants from the singulated electronic die. In one example, the singulated electronic die are exposed to solvent vapors in a low oxygen environment to reduce the present of the film and/or contaminants. In one example, the solvent vapors are provided from one or more heated non-water soluble solvents while the substrate is in a chamber under reduced pressure. In some examples, the singulated electronic die are further exposed to a solvent at atmospheric pressure to reduce the presence of contaminants that are entrapped or embedded within features of the electronic die, such as contact pads. The present examples provide an improved process for removing films and contaminants that leaves the singulated electronic die affixed to a carrier substrate; that provides an increased process window (for example, provides for longer processing times without affecting the adhesion of the die to the carrier substrate) to better insure removal of films and contaminants; and that reduces wastes and manufacturing costs compared to previous approaches.

More particularly, in one example, a method for processing electronic die comprises providing a substrate having a plurality of electronic die formed as part of the substrate and separated from each other by spaces, wherein the substrate has a first major surface and a second major surface opposite to the first major surface. The method includes placing the substrate onto a first carrier substrate. The method includes plasma etching the substrate through the spaces to form singulation lines adjacent the plurality of electronic die. The method includes exposing the plurality of electronic die to solvent vapors under reduced pressure to reduce the presence of residual contaminants resulting from the plasma etching step.

In another example, a method of singulating a semiconductor wafer comprises providing the semiconductor wafer having a plurality of die formed as part of the semiconductor wafer and separated from each other by spaces, wherein the substrate has first and second opposing major surfaces. The method includes providing a first carrier tape attached to a frame and affixing the first carrier tape adjacent to the second major surface. The method includes in a single singulation step, plasma etching the semiconductor through the spaces from the first major surface extending to the second major surface to form singulation lines, wherein the single singulation step provides a plurality of singulated die. The method includes exposing the plurality of singulated die to solvent vapors in a low oxygen chamber to remove at least portions of residual material resulting from the plasma etching step from surfaces of the plurality of singulated die, wherein the plurality of singulated die remain affixed to the first carrier tape after exposure to the solvent vapors.

In a further example, a method of singulating semiconductor die from a semiconductor wafer includes providing the semiconductor wafer having a plurality of semiconductor die formed as part of the semiconductor wafer and separated from each other by spaces defining where singulation lines will be formed, wherein the semiconductor wafer has first and second opposing major surfaces, and wherein a layer of material is formed atop the second major surface. The method include placing a first carrier substrate onto the layer of material. The method includes plasma etching the semiconductor wafer through the spaces to form the singulation lines while the semiconductor wafer is attached to the first carrier substrate and using the layer of material as a stop layer. The method includes separating the layer of material from the singulation lines. The method includes exposing the semiconductor die to solvent vapors in a low oxygen environment to reduce the presence of residual contaminants from surfaces of the plurality of semiconductor die.

Other examples are included in the present description. Such examples can be found in the figures, in the claims, and/or the description of the present disclosure.

FIG. 1 is a reduced plan view that graphically illustrates a semiconductor wafer 10 at a later step in fabrication. Wafer 10 includes a plurality of semiconductor die, such as die 12, 14, 16, and 18, that are formed on or as part of semiconductor wafer 10. Die 12, 14, 16, and 18 are spaced apart from each other on wafer 10 by spaces in which singulation lines are to be formed or defined, such as scribe lines or singulation lines 13, 15, 17, and 19. As is well known in the art, all of the semiconductor die on wafer 10 generally are separated from each other on all sides by areas where scribe lines or singulation lines, such as singulation lines 13, 15, 17, and 19 are to be formed. Die 12, 14, 16, and 18 can be any kind of electronic device including semiconductor devices, such as diodes, transistors, discrete devices, sensor devices, optical devices, integrated circuits or other devices known to one of ordinary skill in the art. In one example, wafer 10 has completed wafer processing including the formation of a backside layer 28 or layer of material 28 described hereinafter. In other examples, layer of material 28 is not included.

Figure 2:
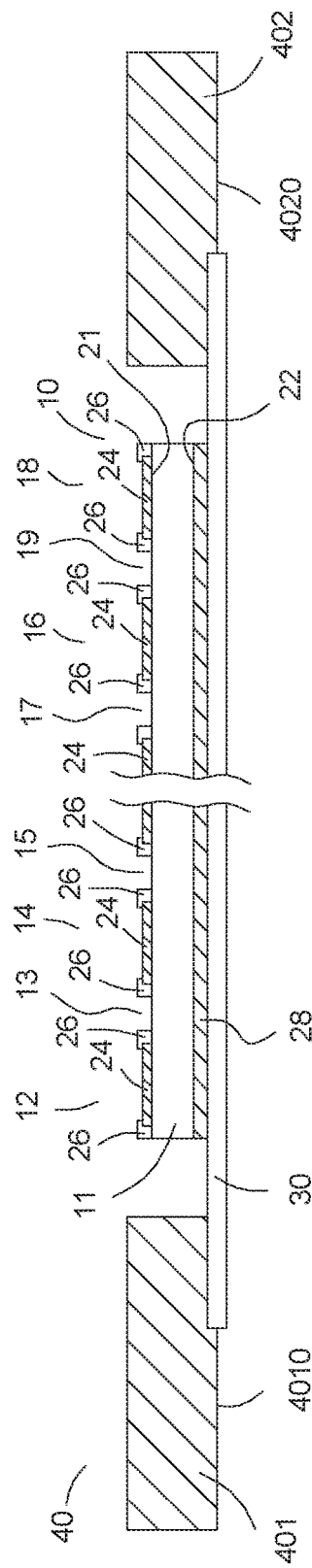
FIGS. 2-4 illustrate partial cross-sectional views of an example of a the semiconductor wafer of FIG. 1 at various stages in a process of singulating die from the wafer in accordance with the present description.

FIG. 2 illustrates an enlarged cross-sectional view of wafer 10 at an early step in a die singulation method in accordance with a first example. In one example, wafer 10 is attached to a substrate, carrier substrate, transfer tape, or carrier tape 30 that facilitates supporting the plurality of die after they are singulated. Such carrier tapes are well known to those of skill in the art. In one example, carrier tape 30 can be attached to a frame 40, which can include frame portions or portions 401 and 402. As illustrated, carrier tape 30 can be attached to surface 4010 of frame portion 401 and to surface 4020 of frame portion 402.

In the cross-section illustrated, wafer 10 can include a bulk substrate 11, such as a semiconductor substrate including a silicon substrate, which can include opposing major surfaces 21 and 22. In one example, contact pads 24 can be formed along or above portions of major surface 21 to provide for electrical contact between structures formed within substrate 11 and next levels of assembly or external elements. For example, contact pads 24 can be formed to receive bonding wires or clips, which may be subsequently attached to contact pads 24, or contact pads 24 can be formed to receive a solder ball, bump or other types of attachment structure as known to one of ordinary skill in the art. Contact pads 24 generally can be one or more metals or other conductive materials as known to one of ordinary skill in the art. In some examples, contact pads 24 can comprise aluminum or an aluminum alloy. Typically, a dielectric material 26, such as a blanket deposited dielectric layer can be formed on, above, or overlying major surface 21 to function as a passivation layer for wafer 10 including the electronic die provided as part of wafer 10. In one example, dielectric material 26 can be a material that etches at a slower rate than that of substrate 11. In one example, dielectric material 26 can be a silicon oxide, silicon nitride, polyimide, combinations thereof when substrate 11 comprises silicon.

In one example, openings can be formed in dielectric material 26 (and other dielectric layers that can be formed underneath or above dielectric material 26) to expose underlying surfaces of contact pads 24 and surfaces of substrate 11 where singulation lines 13, 15, 17, and 19 are to be formed. As set forth previously, in some examples wafer 10 further includes layer of material 28 formed on, atop, above, or overlying major surface 22 of substrate 11. In one example, layer of material 28 can be a conductive backmetal layer. In one example, layer of material 28 can be a multi-layer metal system, such as titanium/nickel/silver, titanium/nickel/silver/tungsten, chrome/nickel/gold, copper, copper alloys, gold, or other materials known to one of ordinary skill in the art. In another example, layer of material 28 can be a wafer backside coating (WBC) film, such as a die-attach film (DAF) coating.

Figure 3:
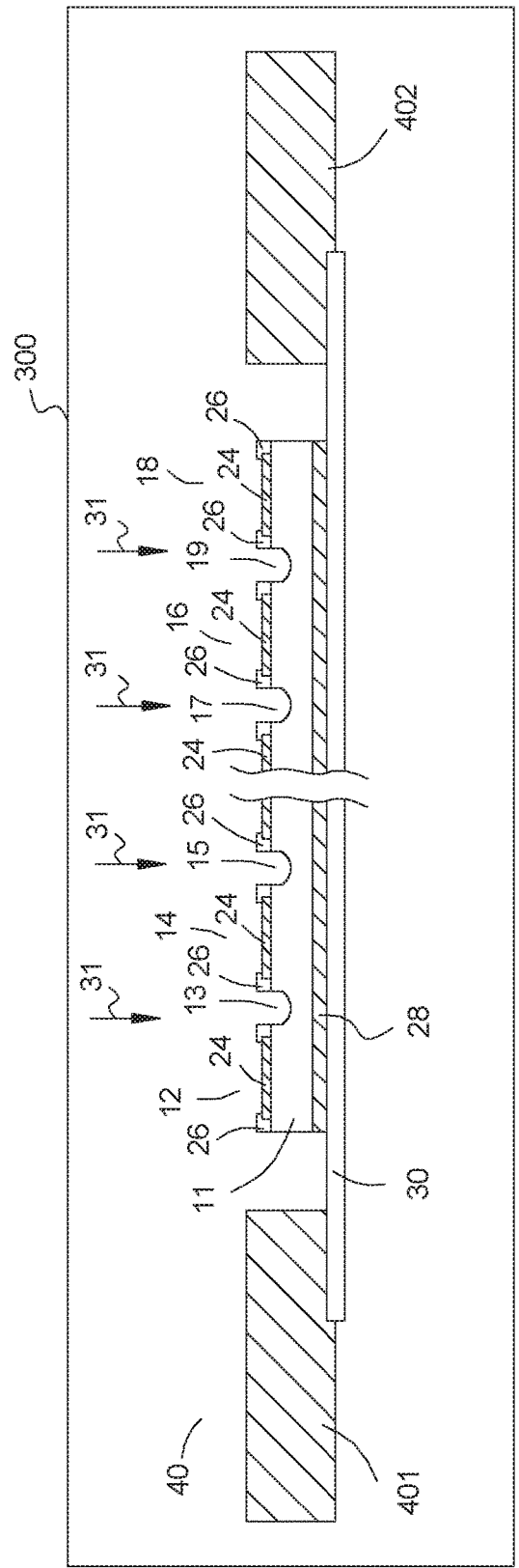
Figure 4:
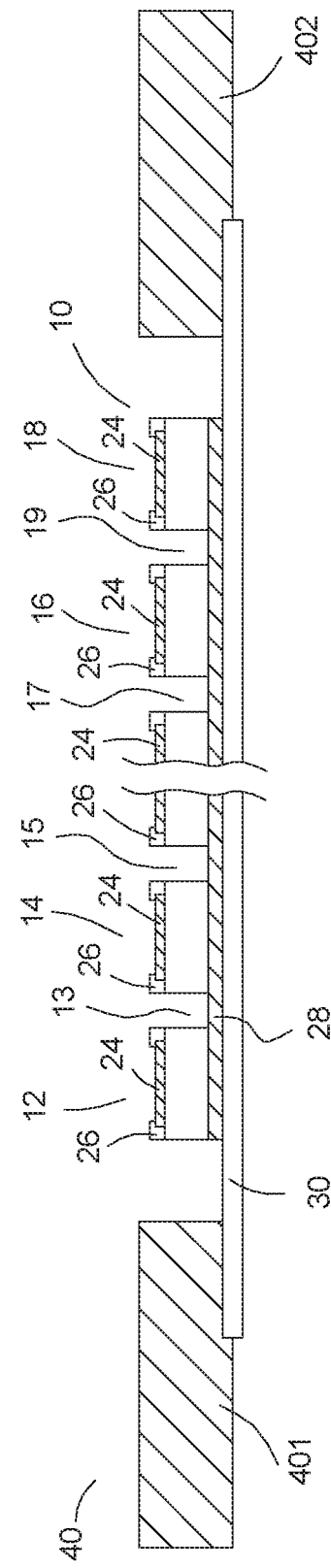

FIG. 3 illustrates an enlarged cross-sectional view of wafer 10 at a subsequent step during a plasma etch singulation process. In one example, wafer 10 can be mounted on carrier tape 30 and then placed within an etch apparatus 300, such as a plasma etch apparatus. In one example, substrate 11 can be etched through the openings to form or define singulation lines or openings 13, 15, 17, and 19 extending from major surface 21 of substrate 11. The etching process can be performed using a chemistry (generally represented as arrows 31) that selectively etches silicon at a much higher rate than that of dielectrics and/or metals. In one example, substrate 11 can be etched using a process commonly referred to as the Bosch process using fluorine and carbon based chemistries. In one example, substrate 11 can be etched using the Bosch process in a deep reactive ion etch system. Such a system is available from PlasmaTherm LLC of St. Petersburg, Fla., U.S.A. In one example, the width of singulation lines 13, 15, 17, and 19 can be from about five microns to about fifteen microns in width. Such a width is sufficient to ensure that the openings that form singulation lines 13, 15, 17, and 19 can be formed completely through substrate 11 stopping proximate to, adjacent to, or adjoining layer of material 28 because of the etch selectivity as generally illustrated in FIG. 4. In other examples, the width of singulation lines 13, 15, 17, and 19 can be wider than fifteen microns. In one example, layer of material 28 can be used as a stop layer for the plasma etch singulation process. In other examples, when layer of material 28 is not used, etching can terminate proximate to, adjacent to, or adjoining carrier substrate 30. In one example, singulation lines 13, 15, 17, and 19 can be formed in about two to about thirty minutes using the Bosch process. In some examples, the etching can terminate before etching entirely through substrate 11, but at least 80% of material is removed from the singulation lines.

During the etch process described previously, residual films, such as a residual polymer layer or contaminants are left on the outer or exposed surfaces of die 12, 14, 16, and 18 including sidewall surfaces adjacent singulation lines 13, 15, 17, and 19 and contact pads 24. These residual films are present whether or not layer of material 28 is included atop the second major surface of wafer 10. It was found through experimentation that these residual films can detrimentally impact the electrical characteristics and reliability of the electronic devices provided as part of die 12, 14, 16, and 18. In some examples, because fluorine and carbon chemistries are used to etch substrate 11, fluorinated polymers can form on wafer 10. In addition, it was found through experimentation that fluorine contaminants may become trapped in surface and sub-surface regions of contact pads 24, which can cause, among other things, corrosion of contact pads 24.

Some processes have been implemented in an attempt to reduce the presence of the polymer materials. Such processes have included plasma ashing and atmospheric solvent cleaning, such as spray solvent cleaning and immersion solvent cleaning. Plasma ashing is known to predominantly remove polymers on horizontal surfaces and is not compatible with deep vertical trench structures or organic top layers, such as polyimide or polybenzoxazole (PBO)-based dielectric materials, which limits its applicability. Spray solvent processing using, for example, water soluble solvents have been shown to provide good polymer removal. However, because of damage to carrier substrates and solvent degradation with existing solvent chemistries, reduced processing times and/or temperatures are necessary, which limits the process window in some cases to partial polymer removal. Immersion solvent cleaning processes using, for example, non-water soluble solvents provide good polymer removal with an expanded process window compared to spray solvent cleaning. However, because of issues such as bath life with current solvent chemistries, cross-contamination, and damage to carrier substrates, an improved process would be beneficial. In addition, wafer level variables such as exposed die size and grid width, die thickness, presence of back-layers (e.g., layer of material 28), side etch profile, size of scalloping, etch rate variations, type of top dielectric layer used (e.g., polymer versus oxide), and wafer center versus wafer edge make the prior processes difficult to optimize. Further, issues with solvent age and solvent temperature add to the difficulty of process optimization. The present description provides a vacuum solvent cleaning method for removing these residual films and contaminants that is an improvement over such prior processes.

Figure 5A:
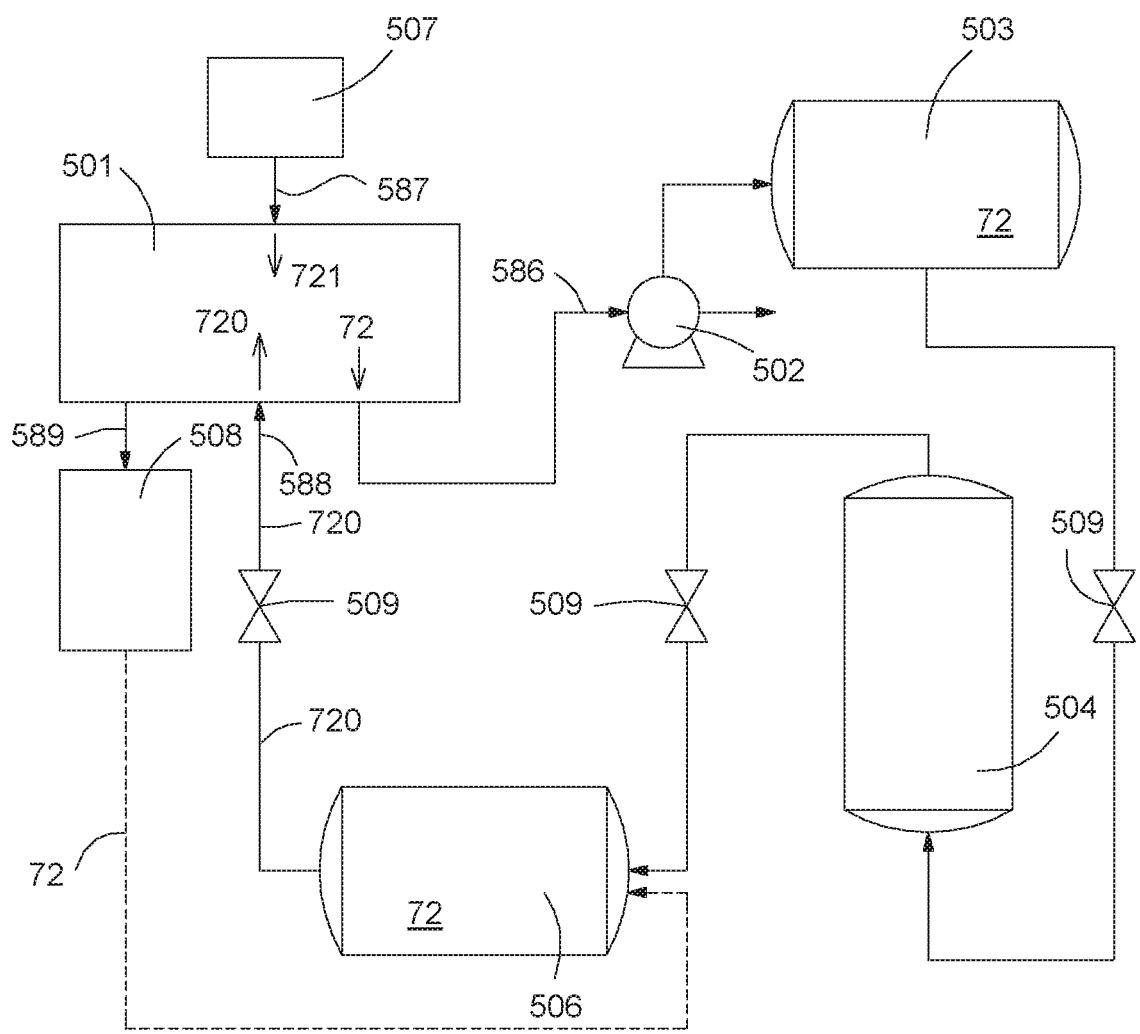
FIG. 5A is a schematic of a vacuum vapor solvent cleaning apparatus in accordance with the present description.

FIG. 5A is a schematic illustrating a vacuum vapor solvent cleaning apparatus 500 for use in removing residual films and contaminants from wafer 10 in accordance with the present description. In some examples, apparatus 500 comprises a sealed chamber 501 adapted for reduced pressure processing, such as a vacuum chamber; a pump 502, such as a vacuum pump configured to provide a pressure below atmospheric pressure within sealed chamber 501; a solvent collection device 503, such as a condenser for condensing solvent vapors from sealed chamber 501; a separation apparatus 504, such as a distillation apparatus configured for providing a solvent 72 for processing wafer 10; a solvent storage device 506 configured to store, heat, and supply solvent vapors 720 to sealed chamber 501; a solvent spray delivery system 507 configured to provide liquid solvent to sealed chamber 501; and a water management system 508 configured for collecting and separating residual water from sealed chamber 501 generated during, for example, early stages of the process. Check valves 509 can be used to control the flow direction of the fluids in apparatus 500.

Figure 5B:
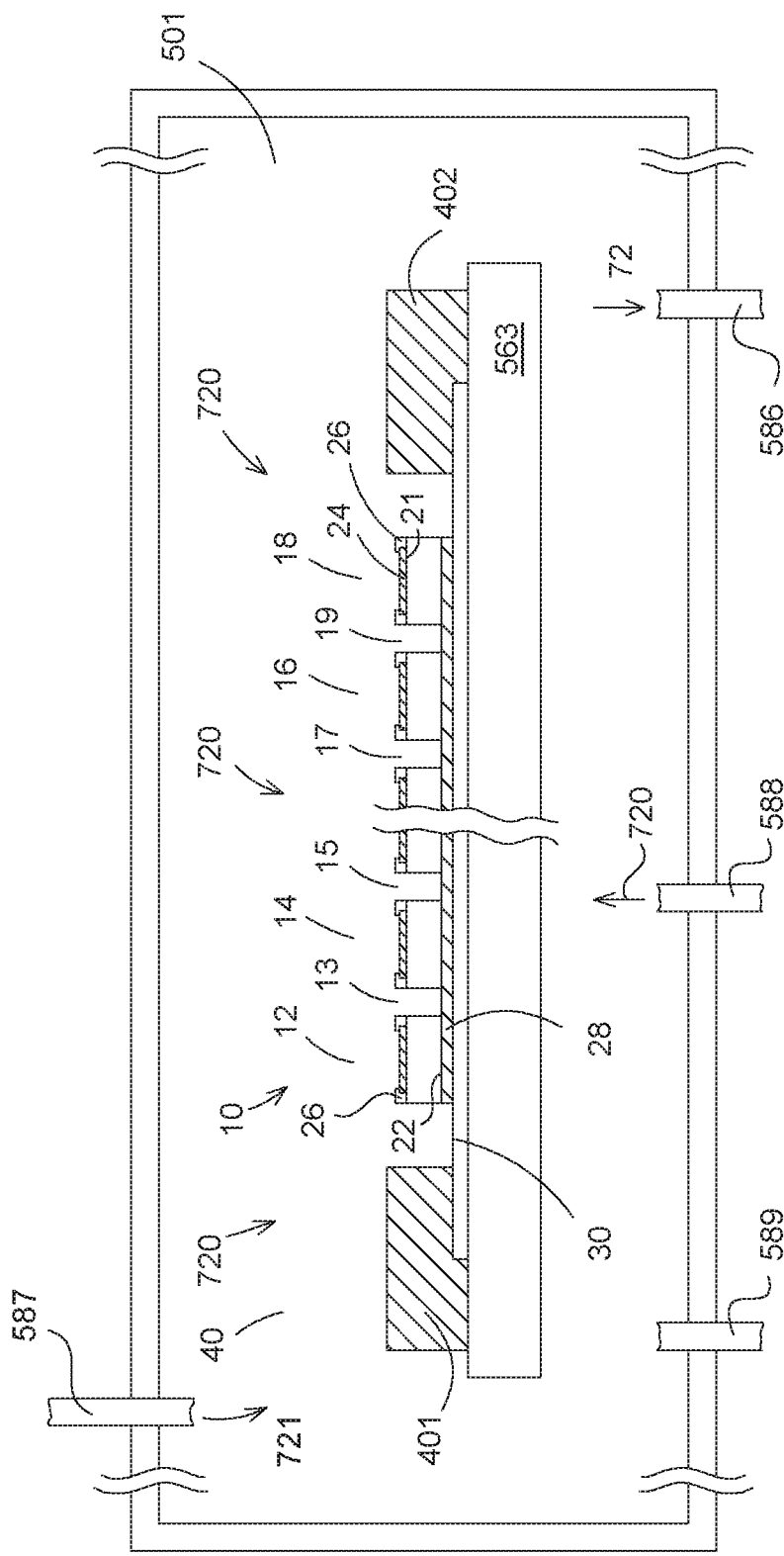
FIG. 5B illustrates a cross-sectional view of a sealed vacuum process chamber portion of the apparatus of FIG. 5A.

FIG. 5B illustrates a cross-sectional view of sealed chamber 501 including wafer 10 situated within the chamber for removal of residual films and/or contaminates from outer or exposed surfaces of die 12, 14, 16, and 18. In some examples, sealed chamber 501 is configured to process a single wafer 10 on carrier substrate 30 as illustrated in FIG. 5B. In other examples, sealed chamber 501 can be configured to process multiple wafers on carrier substrates at one time in a batch process or configuration. In one example, wafer 10 on carrier substrate 30, which can be attached to frame 40, is placed on a support structure 563 for holding or supported wafer 10 during processing.

With reference to both FIGS. 5A and 5B, vacuum pump 502 can be connected to sealed chamber 501 using, for example, a vacuum line 586. Vacuum pump 502 can be configured to reduce the pressure within sealed chamber 501 to a desired pressure below atmospheric pressure. In some examples, a vacuum of about 133 Pascal (about 1 Torr) can be provided within the sealed chamber 501 for processing wafer 10 in accordance with the present description. Any suitable vacuum pump can be used, such as a rotary vane pump, a diaphragm pump, a piston pump, a screw pump, a cryogenic pump, or similar pumps or vacuum devices as known to one of ordinary skill in the art. Line 586 can also be used to remove fluids at the end of the process, which can be collected in solvent collection device 503. The collected solvent 72 from the process fluids can be reprocessed and cleaned using separation apparatus 504, which provides a self-contained system. This is an advantage of the present process because it reduces emissions and manufacturing costs.

Solvent storage device 506 can be connected to sealed chamber 501 using supply line 588. Solvent storage device 506 is configured to store, heat and to supply solvent vapors 720 from heated solvent 72 to sealed chamber 501 for cleaning wafer 10. In some examples, water management system 508 can be connected to sealed chamber 501 using output or collection line 589. As the water flashes off of wafer 10, wafer 10 tends to cool thereby attracting more solvent vapors 720. Once the water is removed from sealed chamber 501, wafer 10 can rise to the operating temperature of solvent vapors 720 to provide enhanced cleaning of wafer 10. Water management system 508 can be used to collect and separate residual water that is flashed off wafer 10 and or sealed chamber 501 early in the processing of wafer 10. The residual water can be separated from solvent 72 from sealed chamber 501 and the separated solvent 72 can be returned to, for example, solvent storage unit 506.

In accordance with the present description, solvent vapors 720 from heated solvent 72 are configured to reduce the presence of residual materials, such as fluorinated polymers from surfaces of singulated die 12, 14, 16, and 18 on wafer 10. In some examples, solvent 72 can be a high vapor pressure solvent that is selective to removing fluorinated polymers that are formed during the plasma dicing step described previously. In some examples, solvent 72 can be a segregated hydrofluoroether (HFE), such as 3M's line of Novec or other high pressure non-water soluble solvents that are selective to dissolving fluorinated polymers compared to other polymers such a polyimides, polybenzoxale (PBO), polyvinyl chloride (PVC), polytetrafluoroethylene (PTFE), or other similar materials. These materials were found through experimentation to remove the residual films, such as fluorinated polymers and other contaminants without impacting carrier substrate 30 or any organic overcoating on wafer 10. In some examples, solvent 72 can comprise AE-1000 solvent or VC-1200 solvent available from Techspray of Kennesaw, Ga., U.S.A. In some examples, wafer 10 can be exposed to solvent vapors 720 for 10 minutes to 60 minutes or more. This is an improvement over previous process that cannot extend process times beyond 30 minutes because of degradation of the carrier substrate, which can result in die falling off of the carrier substrate.

Solvent spray delivery system 507 can be connected to sealed chamber 501 using supply line 587. Solvent spray delivery system 507 can be configured to provide cool solvent spray 721 to sealed chamber 501 under vacuum to reduce the temperature of wafer 10 during the process to further promote the solvent vapors to condense onto wafer 10 and remove the residual films and contaminants. In some examples, solvent spray system 507 can be sourced with solvent 72 from solvent storage device 506 or another source.

In some examples, solvent cleaning apparatus 500 is further configured to vacuum dry wafer 10 after the residual contaminates or films are removed from wafer 10. Vacuum drying lowers the boiling point of the solvent(s) used and enables quick and complete evaporation of all solvents. After vacuum drying, the pressure in sealed chamber 501 can be reduced to promote recovery of solvent 72. After wafer 10 is processed with solvent vapors 720, the solvent vapors can be removed from sealed chamber 501, condensed, and recycled. In some examples, the solvent 72 can be distilled and reused for subsequent processes. In some examples, wafer 10 can be processed for multiple cycles of clean-dry.

The present process can be combined in some examples, with an immersion step where wafer 10 is placed in a solvent bath or sprayed with a solvent fluid at atmospheric pressure as a first removal step, and then followed by vacuum solvent processing system 501 as part of a second removal step. In other examples, this sequence can be reversed with the immersion step in a solvent bath or with a solvent spray at atmospheric pressure occurring after the vacuum solvent step. In some examples, this second step can be done in the same processing equipment as the vacuum solvent step. This second step can be used to remove a portion of contact structures, such as contact pads 24 disposed adjacent to major surface 21 of wafer 10 to remove any unwanted contaminants that form on the surface or within the subsurface of the contact structures.

Some advantages of the present process include, but are not limited to, wet rinsing is not required, which reduces contaminated water discharge; solvents can be distilled and recycled so hazardous waste disposal needs are greatly reduced; vapor phase cleaning as the only clean step eliminates the need to place wafers in contaminated solvent baths; immersion followed by vapor cleaning provides a final cleaning step to further reduce the present of contaminants, such as residual films on the wafers; sealed chamber 501 reduces vapor loss/emission problems with nearly full solvent recovery and re-use; "air-less" solvent enables an optional spray clean of high vapor pressure solvents; "air-less" solvent provides enhanced cleaning capability; and by using vacuum drying of the wafers, the boiling point of the solvents is lowered, which enables faster and complete evaporation of all solvents and reduces the need for post rinses or based as required with prior systems. In addition, the present process exhibits a broader process window compared to previous method in both processing time and temperature thereby improving the removal of the residual films and contaminants. This is an advantage when, for example, the residual films are thick. Moreover, the method according to the present description is compatible with carrier substrates, such as carrier tapes so that the singulated die remain affixed to the carrier tape after exposure to the solvent vapors.

Figure 6:
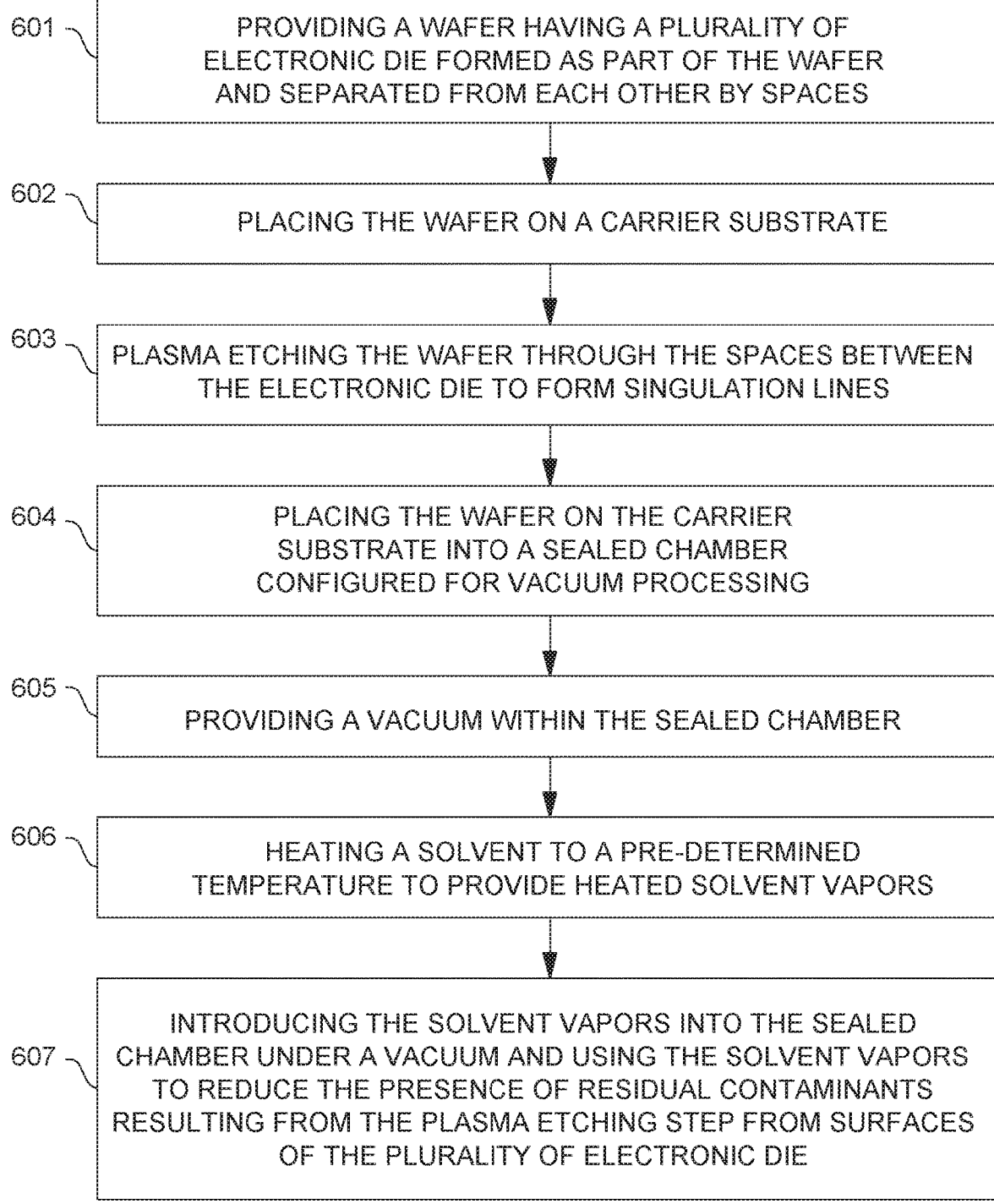
FIG. 6 illustrates a flow chart of a method in accordance with the present description.

FIG. 6 is a flow chart of an example method singulating die from wafer (for example, wafer 10) using plasma etch singulation, and removing residual contamination from the singulated die (for example, die 12, 14, 16, and 18) after plasma singulation step in accordance with the present description. The method includes a step 601 of providing a wafer having a plurality of electronic die formed as part of the wafer and separated from each other by spaces. By way of example, this can include wafer 10 as illustrated in FIGS. 1 and 2.

The method includes a step 602 of placing the wafer on a carrier substrate. In some examples, the wafer can include wafer 10 and the carrier substrate can include carrier substrate 30 or other carrier substrates as known to one of ordinary skill in the art.

The method includes a step 603 of plasma etching the wafer through the spaces between the electronic die to form singulation lines. In some examples, the wafer is etched in accordance with the description of FIG. 3 where wafer 10 is plasma etched to form singulation lines 13, 15, 17, and 19. In some examples, wafer 10 includes a back layer 28, such as a conductive layer, a wafer back coating (WBC), or a die attach film (DAF), in which case the etching step can termination proximate to the back layer 28. During the etching step, residual material and contaminants from the etching process can remain at least along some of the side surfaces of the singulated electronic die, such as electronic die 12, 14, 16, and 18. Such residual materials can include fluorinated polymer material and/or fluorine when fluorine and carbon etch chemistries are used to form singulation lines 13, 15, 17, and 19.

The method includes a step 604 of placing the wafer on the carrier substrate in a chamber apparatus configured for vacuum processing. By way of example, wafer 10 on carrier substrate 30 can be placed in sealed chamber 501 as part of a vacuum vapor solvent cleaning apparatus 500 as described in FIGS. 5A and 5B. In other examples, a different carrier substrate can placed adjacent the first major surface of wafer 10 and carrier substrate 30 can be removed before the wafer is placed in sealed chamber. In some examples, sealed chamber 501 can be preheated to a predetermined temperature before wafer 10 is placed on support structure 563. The method includes a step 605 of providing a vacuum or reducing the presence of oxygen or air within sealed chamber 501. In some examples, sealed chamber 501 can be evacuated to a desired reduced pressure or vacuum using vacuum pump 502 as illustrated in FIG. 5A. In some examples, a starting vacuum of about 133 Pascal (about 1 Torr) is used.

The method includes a step 606 of heating a solvent to a predetermined temperature to provide a solvent vapor. By way of example, apparatus 501 can be used with solvent 72 heated to provide solvent vapors 720 as illustrated in FIGS. 5A and 5B. The method includes a step 607 of introducing the heated solvent vapor into the sealed chamber apparatus and using the solvent vapor to reduce the presence of residual contaminants resulting from the plasma etching step from surfaces of the plurality of singulated electronic die. Heated solvent vapors 720 condense on exposed surfaces of wafer 10 to reduce the presence of unwanted films and contaminants. By way of example, apparatus 500 can be used to expose wafer 10 to heated solvent vapors 720 under vacuum to reduce the present of residual contaminants, such as fluorinated polymer films on side surfaces of singulated electronic die 12, 14, 16, and 18 as illustrated in FIG. 5B. In some examples, the solvent can include a non-water soluble solvent, such as a segregated hydrofluoroether (HFE) solvent. At this stage of processing, wafer 10 can be dried of the solvent by vacuum drying. After vacuum drying, the pressure in sealed chamber 501 can be reduced to assure the collection of solvent. The collected solvent can then be separated by apparatus 500 for future use.

Figure 7:
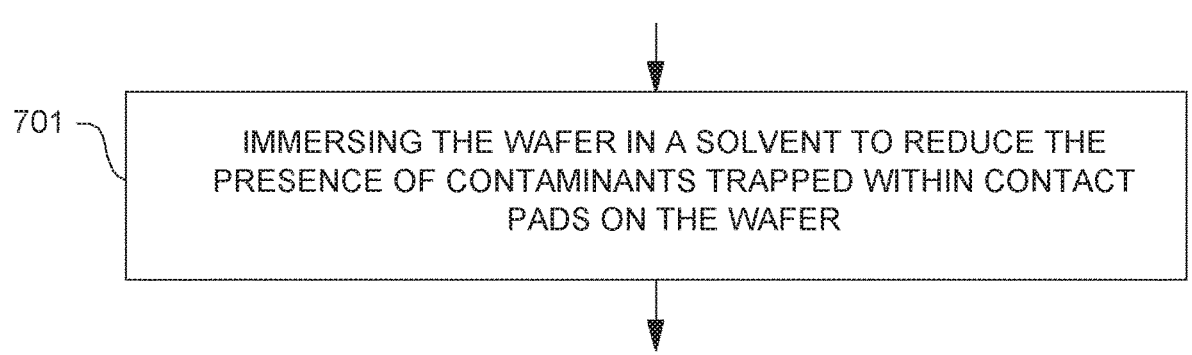
FIG. 7 illustrates a flow chart of another method step in accordance with the present description.

The present process can be combined in some examples with a step 701 as shown in FIG. 7, which comprises immersing the wafer within a solvent to reduce the presence of contaminants trapped on and within, for example, contact pads on the wafer. In some examples, step 701 can be used with wafer 10 having contact pads 24. It was found through experimentation that residual fluorine contaminants from the plasma singulation step can become trapped within or diffuse into contact pads 24 with certain contact pad materials, such as those comprising aluminum. It was further found through experimentation that the presence of this trapped fluorine can be reduced using the immersion step in a solvent bath or with a solvent spray. In some instances, an acidic or basic solution can be used instead of solvent. In some examples, the immersion step comprises placing wafer 10 in a solvent bath or exposing wafer 10 to a solvent spray at atmospheric pressure as a second removal step after the vacuum solvent processing step. In other examples, this sequence can be reversed with the immersion step in a solvent bath or with a solvent spray at atmospheric pressure occurring before the vacuum solvent step (e.g., before step 605 of FIG. 6). In some instances, this step can done in a vacuum solvent tool (e.g., also within chamber 501) by combining two solvents or by using a single solvent that etches or removes portions of the bond pad surface.

Figure 8:
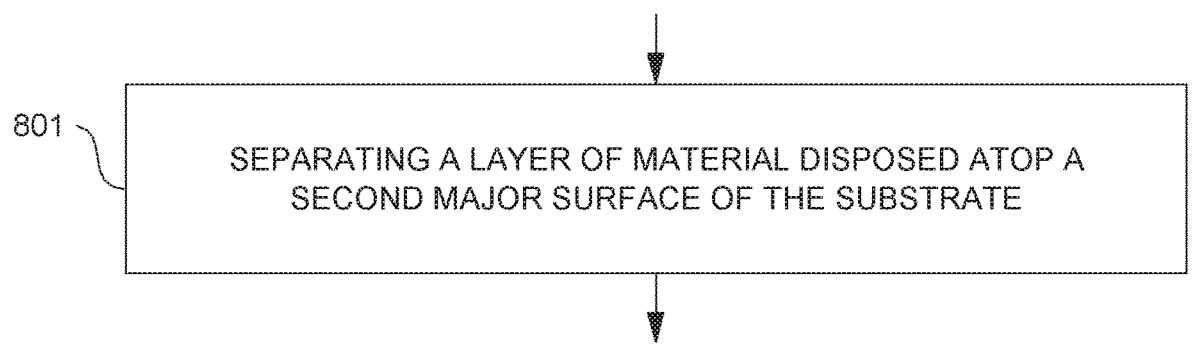
FIG. 8 illustrates a flow chart of another method step in accordance with the present description.

After the method described in FIG. 6 and FIG. 7 is complete, if wafer 10 has a layer of material 28 present, wafer 10 on carrier substrate 30 can be further processed in accordance with a step 801 illustrated in FIG. 8 to separate portions of the back layer 28 in singulation lines 13, 15, 17, and 19 using fluid jet ablation, stylus separation techniques, or global fluid pressure separation techniques. The singulated electronic die 12, 14, 16, and 18 can then be removed from carrier substrate 30 using, for example, pick-and-place equipment to further assemble the die in packages, such as molded electronic packages.

In other examples, the solvent cleaning process in accordance with the present description can occur after layer of material 28 is separated in step 801. In some examples, an additional carrier substrate can be applied to major surface 21 of wafer 10 after the plasma etching step and then carrier substrate 30 can be removed to expose the opposite surface of wafer 10. In this example, the solvent cleaning process can be used after the carrier substrate 30 is removed while the additional carrier substrate is in place on major surface of wafer 10.

From all of the foregoing, one of skill in the art can determine that in accordance with one example, separating the back layer can occur after using the solvent vapors. In another example, an immersion solvent step can occur before using the solvent vapors. In a further example, the chamber can be heated to a predetermined temperature before using the solvent vapors.

From all of the foregoing, one of skill in the art can determine that in accordance with one example, physically separating the layer of material can comprise physically separating first portions of the layer of material using a first fluid ablation process while the layer of material is attached to the first carrier substrate; attaching a second carrier substrate to the first major surface of the semiconductor wafer; removing the first carrier substrate; physically separating second portions of the layer of material using a second fluid ablation process; attaching a third carrier substrate onto the second major surface after removing the second portions; and removing the second carrier substrate. In another example, physically separating the layer of material includes attaching a second carrier substrate to the first major surface of the semiconductor wafer; removing the first carrier substrate; and removing the layer of material from the singulation lines using a fluid.

From all of the foregoing, one of skill in the art can determine that in accordance with one example, providing the layer of material can comprise providing one or more layer of conductive material. In another example, providing the layer of material can include providing one or more of a wafer back coating or a die attach film layer.

In view of all of the above, it is evident that a novel method is disclosed. Included, among other features, is placing a semiconductor wafer having a plurality of die onto a carrier tape, and forming singulation lines through the substrate to separate at least in part the plurality of die. The method includes exposing surfaces of the plurality of die to solvent vapors in a low oxygen chamber to remove residual contaminates, such as fluorinated polymer films. In some examples, the method can be combined with a solvent immersion or spray step to remove contaminants trapped on or within features on the wafer. The method improves the quality and reliability of the electronic die singulated using plasma dicing techniques.

While the subject matter of the invention is described with specific preferred examples and example examples, the foregoing drawings and descriptions thereof depict only typical examples of the subject matter, and are not therefore to be considered limiting of its scope. It is evident that many alternatives and variations will be apparent to those skilled in the art. For example, other forms of removable support materials can be used instead of carrier tapes. For example, the support structure in apparatus 500 can be confirmed to rotate wafer 10 during the process. For example, ultrasonic vibrations can be added during the process.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some but not other features included in other examples, combinations of features of different examples are meant to be within the scope of the invention and meant to form different examples as would be understood by those skilled in the art.

What is claimed is:

1. A method for processing electronic die, comprising:
providing a substrate having a plurality of electronic die formed as part of the substrate and separated from each other by spaces, wherein the substrate has a first major surface and a second major surface opposite to the first major surface;
placing the substrate onto a first carrier substrate;
plasma etching the substrate through the spaces to form singulation lines adjacent to the plurality of electronic die;
placing the substrate within a sealed chamber, the sealed chamber adapted for reduced pressure processing;
providing a reduced pressure within the sealed chamber so that the plurality of electronic die is directly exposed to the reduced pressure; and
exposing the plurality of electronic die to solvent vapors while the sealed chamber is under the reduced pressure to reduce the presence of residual contaminants on the plurality of electronic die and within the singulation lines resulting from the plasma etching step.

2. The method of claim 1, wherein exposing the plurality of electronic die to the solvent vapors comprises:
exposing using heated solvent vapors.

3. The method of claim 1, wherein:
placing the plurality of electronic die comprises placing the plurality of electronic die attached to the first carrier substrate.

4. The method of claim 1, wherein:
exposing comprises exposing using heated solvent vapors comprising hydrofluoroether (HFE).

5. The method of claim 1, wherein:
providing the substrate comprises providing a layer of material atop the second major surface of the substrate.

6. The method of claim 5, wherein:
providing the layer of material comprises providing one or more of a conductive layer, a wafer back coating layer, or a die attach film.

7. The method of claim 5, further comprising:
separating the layer of material after the step of plasma etching.

8. The method of claim 7, wherein:
separating the layer of material occurs before the exposing step.

9. The method of claim 1, further comprising:
exposing the plurality of electronic die to a second solvent at atmospheric pressure.

10. The method of claim 9, wherein:
exposing the plurality of electronic die to the second solvent occurs after exposing the plurality of electronic die to the solvent vapors.

11. The method of claim 9, wherein:
exposing to the second solvent comprises one or more of immersing or spraying the plurality of electronic die in the second solvent.

12. The method of claim 1, wherein:
providing the substrate comprises providing contact structures disposed adjacent to the first major surface; and
the method further comprises removing a portion of the contact structures after the plasma etching step.

13. A method of singulating a semiconductor wafer, comprising:
providing the semiconductor wafer having a plurality of die formed as part of the semiconductor wafer and separated from each other by spaces, wherein the semiconductor wafer has first and second opposing major surfaces;
providing a first carrier tape;
affixing the first carrier tape adjacent to the second major surface;
in a single singulation step, plasma etching the semiconductor wafer through the spaces from the first major surface extending to the second major surface to form singulation lines, wherein the single singulation step provides a plurality of singulated die; and
exposing the plurality of singulated die to solvent vapors in a low oxygen chamber to remove at least portions of residual material resulting from the plasma etching step from surfaces of the plurality of singulated die, wherein the plurality of singulated die remain affixed to the first carrier tape after exposure to the solvent vapors.

14. The method of claim 13, wherein:
plasma etching includes exposing portions of the first carrier tape; and
exposing the plurality of singulated die comprises exposing the exposed portions of the first carrier tape adjacent the plurality of singulated die to the solvent vapors.

15. The method of claim 13, wherein exposing comprises exposing to a hydrofluoroether (HFE) solvent vapors.

16. The method of claim 13, wherein:
providing the semiconductor wafer comprises providing a layer of material disposed atop the second major surface;
affixing the first carrier tape comprises affixing the first carrier tape directly to the layer of material;
plasma etching comprises terminating the plasma etching step proximate to the layer of material; and
the method further comprises physically separating the layer of material from the singulation lines.

17. A method of singulating semiconductor die from a semiconductor wafer, comprising:
providing the semiconductor wafer having a plurality of semiconductor die formed as part of the semiconductor wafer and separated from each other by spaces defining where singulation lines will be formed, wherein the semiconductor wafer has first and second opposing major surfaces, and wherein a layer of material is formed atop the second major surface;
placing a first carrier substrate onto the layer of material;
plasma etching the semiconductor wafer through the spaces to form the singulation lines while the semiconductor wafer is attached to the first carrier substrate and using the layer of material as a stop layer;
separating the layer of material from the singulation lines; and
exposing the plurality of semiconductor die to solvent vapors in a low oxygen environment to reduce the presence of residual contaminants from surfaces of the plurality of semiconductor die.

18. The method of claim 17, wherein:
the step of exposing is performed before the step of separating the layer of material; and
the plurality of semiconductor die remain affixed to the first carrier substrate after the step of exposing.

19. The method of claim 17, wherein exposing the plurality of semiconductor die comprises:
providing an apparatus comprising a chamber adapted for vacuum processing;
placing the semiconductor wafer within the chamber;

providing a vacuum within the chamber to provide the low oxygen environment; and exposing using heated solvent vapors.

20. The method of claim 17, further comprising:

exposing the plurality of semiconductor die to a second solvent at atmospheric pressure.

* * * * *